United States Patent [19]

Bailey

[11] Patent Number: 5,530,284

[45] Date of Patent: Jun. 25, 1996

[54] SEMICONDUCTOR LEADFRAME STRUCTURE COMPATIBLE WITH DIFFERING BOND WIRE MATERIALS

[75] Inventor: Keith W. Bailey, Mesa, Ariz.

[73] Assignee: Motorola, Inc., Schaumburg, Ill.

[21] Appl. No.: 398,830

[22] Filed: Mar. 6, 1995

[51] Int. Cl.$^6$ .......................... H01L 23/48; H01L 29/52; H01L 23/28
[52] U.S. Cl. .......................... 257/670; 257/666; 257/676; 257/782; 257/672; 257/735
[58] Field of Search .......................... 257/666, 670, 257/672, 673, 676, 735, 737, 773, 779, 780, 782

[56] References Cited

U.S. PATENT DOCUMENTS

| | | | |
|---|---|---|---|
| 4,451,845 | 5/1984 | Philotsky et al. | 257/782 |
| 4,947,236 | 8/1990 | Suga et al. | 257/676 |
| 5,049,973 | 9/1991 | Satriano et al. | 257/670 |
| 5,277,356 | 1/1994 | Kawauchi | 228/111 |
| 5,313,095 | 5/1994 | Tagawa et al. | 257/666 |
| 5,338,704 | 8/1994 | Imai et al. | 437/209 |
| 5,399,905 | 3/1995 | Honda et al. | 257/676 |

FOREIGN PATENT DOCUMENTS

| | | | |
|---|---|---|---|
| 0144154 | 8/1984 | Japan | 257/666 |
| 0194755 | 8/1986 | Japan | 257/676 |
| 0278053 | 11/1989 | Japan | 257/666 |
| 0258157 | 9/1992 | Japan | 257/666 |

Primary Examiner—Rolf Hille
Assistant Examiner—Alexander Oscar Williams
Attorney, Agent, or Firm—Kevin B. Jackson

[57] ABSTRACT

A semiconductor leadframe structure (11,41) includes a die bond portion (12) and a plurality of leads (13) coupled to the die bond portion (12). The leadframe structure (11) comprises a metal (23) such as copper or a copper alloy. At least one lead (28,29) includes a bond post (31) that has a major surface (32) for forming a wire bond. The major surface (32) includes an exposed area (33) of leadframe metal (23) and a covered area (34) of another metal (24) deposited onto the leadframe metal (23).

20 Claims, 2 Drawing Sheets

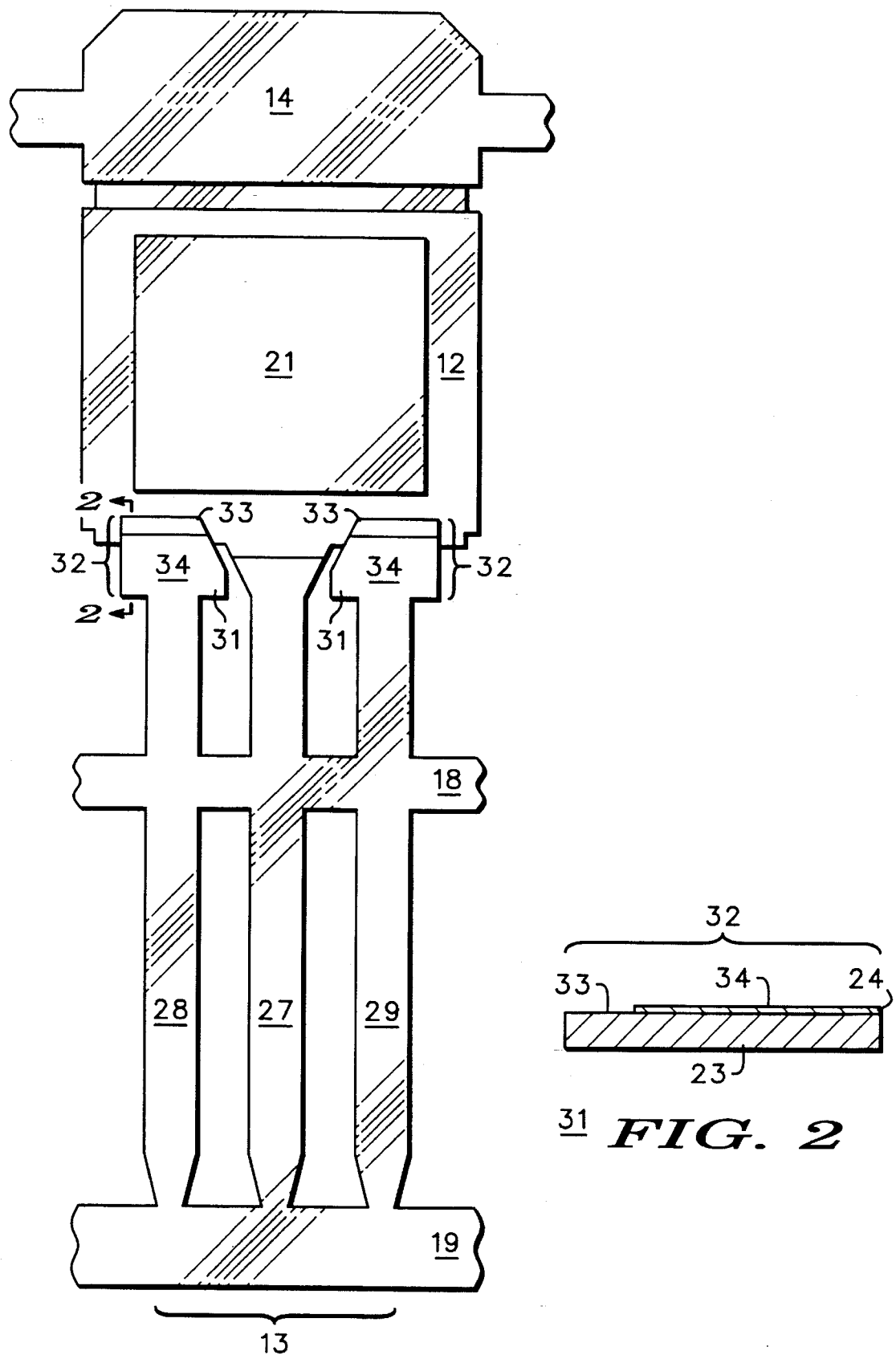

SEMICONDUCTOR LEADFRAME STRUCTURE COMPATIBLE WITH DIFFERING BOND WIRE MATERIALS

BACKGROUND OF THE INVENTION

The present invention relates, in general, to semiconductor devices, and in particular to leadframes for power semiconductor devices that permit different bond wire materials within the same package.

Current leadframes for power semiconductor device packages (e.g., TO-218, TO-220, DPAK, D²PAK, D³PAK) typically are formed or stamped from a ribbon of a single or dual gauge metal material such as copper or a copper alloy. Typically, prior to stamping, all or part of the ribbon material is plated with another metal. After stamping, a typical power semiconductor leadframe comprises a die bond pad and a plurality of leads either connected to the die bond pad or in proximity to it. All or some of the leads include a bond post portion for connecting (e.g., wire bonding) a semiconductor die to the leads.

In higher current power semiconductor packages, manufacturer's often use a large diameter aluminum wire to wire bond a current carrying electrode (e.g., a source electrode on insulated gate field effect transistor (IGFET) devices) on the semiconductor die to a lead. When aluminum wires are used, the bond posts are completely covered with nickel because aluminum does not bond well with copper. In addition, the leads typically are plated with nickel.

When an aluminum wire is used for the current carrying electrode wire bond, manufacturers have to use an aluminum wire to wire bond a control electrode (e.g., a gate electrode in an IGFET device) on the semiconductor die to one of the leads. This is because other bond wire materials such as gold or copper are incompatible with nickel covered bond posts.

Aluminum bond wires for the control electrode typically have a diameter on the order of 0.10 to 0.13 millimeters (mm) (approximately 4 to 5 mils). Using a control electrode bond wire of this diameter results in several limitations. For example, it requires manufacturers to use a large control electrode pad on the semiconductor die in order to accommodate the large diameter control electrode bond wire. This severely limits a manufacturer's ability to reduce die dimensions, which in turn impacts manufacturing costs and design flexibility.

What is needed is a cost effective leadframe structure that permits a manufacturer to use different bond wire materials within the same power semiconductor package.

BRIEF DESCRIPTION OF THE DRAWINGS

FIG. 1 is an enlarged top view of a leadframe structure according to the present invention;

FIG. 2 is a enlarged cross-sectional view of a portion of the leadframe structure of FIG. 1 taken along reference line 2;

DETAILED DESCRIPTION OF THE DRAWINGS

Figure 3:
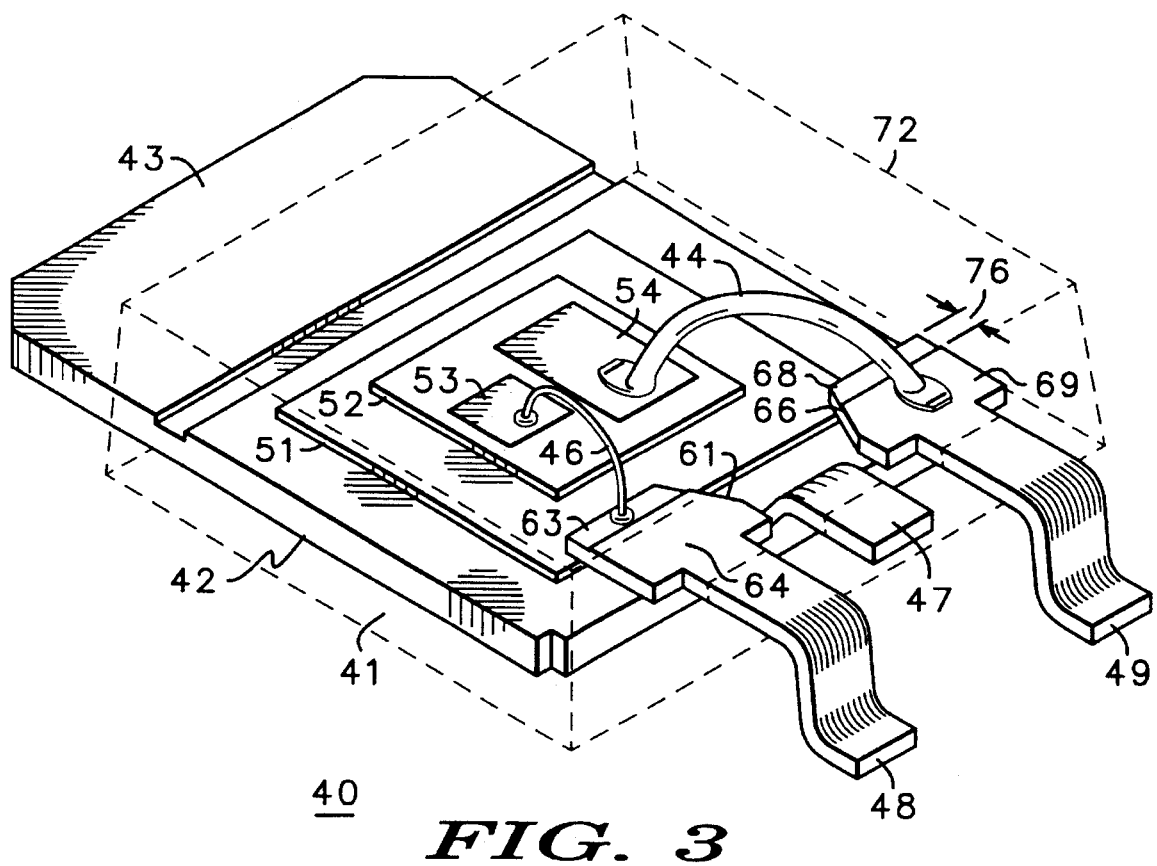
FIG. 3 is a perspective view of a power semiconductor package including a leadframe structure according to the present invention.

Generally, the present invention provides a semiconductor leadframe structure for power semiconductor devices that accommodates different types of bond wire materials within the same package. In particular, the leadframe structure includes a tab portion and at least one lead coupled to the die bond portion. The leadframe structure comprises a first metal material. The lead includes a bond post having a major surface for bonding a connecting wire. One portion of the major surface comprises an exposed area of the first metal and a remaining area of the major surface comprises a second metal deposited onto the first metal.

One can more fully understand the present invention by referring to FIGS. 1–4 together with the following detailed description. FIG. 1 illustrates an enlarged top view of a leadframe structure or leadframe 11 according to the present invention. In general, leadframe 11 includes a die bond portion 12, a plurality of leads 13, and a top portion 14. Together, die bond portion 12 and top portion 14 are often referred to as the "tab" portion. Die bond portion 12 includes a die bond pad or area 21. Lead frame 11 preferably comprises copper, a copper alloy (e.g., TOMAC 4, TAMAC 5, 2ZFROFC, CDA194), a copper plated iron/nickel alloy (e.g., copper plated Alloy 42), or the like. As will be discussed in more detail below, leadframe 11 is stamped from a ribbon substrate to a predetermined structure or form, such as the form shown in FIG. 1.

Leads 13 include, for example, center lead 27, control lead 28, and current carrying lead 29. Center lead 27 is shown connected directly to die bond portion 12. In certain applications, center lead 27 also can be a current carrying lead. Leadframe 11 is shown with dambar 18 and bottom rail 19, which couple control lead 28 and current carrying lead 29 to die bond portion 12 (through center lead 27). As is well known in the art, dambar 18 and bottom rail 19 are subsequently removed during final package assembly. It is understood that leads 13 can include less or additional leads.

Control lead 28 and current carrying lead 29 each include a bond post 31. Each bond post 31 includes a major surface 32 for forming a wire bond. In the embodiment shown, major surface 32 is the upper surface of bond post 31. Major surface 32 includes an important feature of the present invention. In particular, major surface 32 includes an exposed portion or area 33 and a covered or remaining portion 34.

As shown in FIG. 2, which is an enlarged cross-sectional view of bond post 31 taken along reference line 2 in FIG. 1, exposed portion 33 comprises exposed leadframe metal or material 23 and covered portion 34 comprises a second metal 24 deposited onto leadframe material 23. The configuration of bond post 31 is an important feature because a manufacturer can wire bond a bond wire comprising one material to exposed portion 33 on control lead 28 and wire bond a bond wire comprising a second material to covered portion 34 on current carrying lead 29 or vice versa. This is more readily apparent with reference to FIG. 3.

FIG. 3 illustrates an enlarged perspective view of a power semiconductor device 40 that includes a leadframe structure or leadframe 41 according to the present invention. Power semiconductor device 40 is commonly referred to as a "DPAK" device package. It is understood that this embodiment is shown as an example only and that other package configurations (e.g., TO-218, TO-220, TO-247, D²PAK, D³PAK, or the like) are possible. Leadframe 41 is shown encapsulated or covered with encapsulant 72. Although encapsulant 72 typically is opaque, it is shown clear (i.e., as a dashed line) to show the elements inside of the encapsulated device. Leadframe structure 41 is similar to leadframe 11 except for the shape of the leads. Leadframe structure 41 includes die bond portion 42, top portion 43, center lead 47, control lead 48, and current carrying lead 49. Die bond portion 42 includes a die bond area 51.

Control lead 48 includes a bond post 61 having an upper or major surface that includes an exposed portion 63 and a covered portion 64. Current carrying lead 49 includes a bond post 66 having an upper surface that preferably includes both an exposed portion 68 and a covered portion 69. Like bond post 31 shown in FIG. 2, exposed portions 63 and 68 comprise exposed leadframe material and covered portions 64 and 69 comprise a second metal deposited onto the leadframe material.

Power semiconductor device 40 further includes a semiconductor die or device 52 bonded to die attach area 51. The lower surface of semiconductor die 52 is bonded to die attach area 51 using, for example, a soft solder system such as a lead/tin (Pb/Sn) solder. Semiconductor die 52 comprises a power bipolar transistor device, a thyristor device, an insulated gate bipolar transistor (IGBT) device, a power insulated gate field effect transistor (IGFET) device, a rectifier device, or the like. Semiconductor die 52 typically includes a control electrode pad 53 and a current carrying electrode pad 54 formed on an upper surface of semiconductor die 52.

In FIG. 3, semiconductor die 52 is shown as an IGFET device for purposes of illustration only. In an IGFET device, control electrode pad 53 typically is referred to as the "gate pad" and current carrying electrode pad 54 typically is referred to as the "source pad". Control electrode pad 53 is shown connected or wire bonded to exposed area 63 using bond wire 46 and current carrying electrode pad 54 is connected or wire bonded to covered area 69 using bond wire 44. Control electrode pad 53 and current carrying electrode pad 54 comprise a metal that is compatible (i.e., forms good bonds) with bond wires 44 and 46. Typically, control electrode pad 53 and current carrying electrode pad 54 comprise aluminum or an aluminum alloy (e.g., aluminum/silicon) and are formed using well known techniques.

Typically, in high current applications, bond wire 44 comprises aluminum and has a diameter in a range from 0.13 to 0.38 mm (5 to 15 mils). When bond wire 44 comprises aluminum, the second metal deposited onto covered portions 64 and 69 typically comprises a nickel-based metal (e.g., nickel and/or nickel doped with phosphorous). With exposed portion 63, a manufacturer can use different bond wire materials within the same package. Bond wire 46 preferably comprises a smaller diameter bond wire such as a gold or copper bond wire and is bonded to exposed portion 63. In prior art leadframes, the major surfaces of the bond posts consist entirely of the deposited second metal (e.g., nickel) making such a configuration impossible. This is because bond wires comprising gold or copper are incompatible (e.g., they exhibit poor bonding characteristics) with nickel.

Exposed portion 63 provides a significant advantage over prior art leadframes because it allows a manufacturer to use smaller diameter wires for bond wire 46. Gold and copper wires are preferred for bond wire 46 because they have proven reliability and established wire bonding processes. When bond wire 46 comprises gold or copper, the diameter of bond wire 46 is on the order of 0.02 to 0.025 mm (0.8 to 1.0 mil) compared to 0.10 to 0.13 mm (4 to 5 mils) when bond wire 46 comprises aluminum. This reduction in bond wire diameter allows, among other things, a manufacturer to reduce the size of control electrode pad 53. This in turn results in smaller die sizes, which reduces costs. It addition, smaller die sizes allow a manufacturer to reduce the size of semiconductor packages, which improves portability (i.e., less weight and application space consumption).

Although bond post 61 and bond post 66 are shown with exposed portions 63 and 68 respectively, it is understood that only exposed portion 63 is necessary to accommodate differing bond wire materials. Optionally, all of the major surface of bond post 61 comprises exposed leadframe material and all or a portion of the major surface of bond post 66 is covered with the second metal. However, as will be further discussed below, it is preferred that both bond posts have an exposed portion for ease of manufacture and for design flexibility. Also, center lead 47 may include a similarly exposed region.

Preferably, when both bond posts 61 and 66 include an exposed portion, exposed portions 63 and 66 have a width 76 such that covered portions 64 and 69 are of sufficient size to accommodate an aluminum bond wire (e.g., bond wire 44 on current carrying lead 49). This provides design flexibility because it also allows a manufacturer to use an aluminum wire for bond wire 44 and an aluminum wire for bond wire 46 if necessary. In other words, when width 76 is at least 0.13 mm but less than approximately 0.50 mm (5 to 20 mils), bond post 61 can accommodate, for example, a gold, a copper, or an aluminum bond wire, depending on the application requirements. This allows a manufacturer to use the same leadframe structure to make a device having the same type of bond wire for both the control and current carrying wirebonds or a device having one type of bond wire for the current carrying wirebond and a different type of bond wire for the control wirebond.

As shown in FIG. 3, control lead 48 and current carrying lead 49 are in proximity to or in spaced relationship with die bond portion 42. That is, bond post 61 on control lead 48 and bond post 66 on current carrying lead 49 are above die bond portion 42 in this embodiment. As is shown in FIG. 1, control lead 48 and current carrying lead 49 are held in place (i.e., coupled to die bond portion 42) prior to encapsulation by a dambar (e.g., dambar 18 shown in FIG. 1) and bottom rail (e.g., bottom rail 19 shown in FIG. 1), which are subsequently removed to provide the configuration shown in FIG. 3. Encapsulant 72 covers at least die bond area 51, semiconductor die 52, bond wires 44 and 46, and bond posts 61 and 66. Methods for forming power semiconductor device 40 are well known in art.

It is understood that more than just covered portions 64 and 69 may have a second metal (e.g., second metal 24 shown in FIG. 2) deposited onto the leadframe material. For example, in some applications, top portion 43, die bond portion 42, and the remaining areas of center lead 47, control lead 48, and current carrying lead 49 (except for exposed portions 63 and 68) have the second metal deposited onto the leadframe material. Optionally, only top portion 43 and the remaining areas of center lead 47, control lead 48, and current carrying lead 49 (except for exposed portions 63 and 68) have the second metal deposited onto the leadframe material. For the present invention, at least one bond post includes an exposed area of leadframe material and at least one other bond post includes a covered area of a second metal deposited onto the leadframe material.

Figure 4:
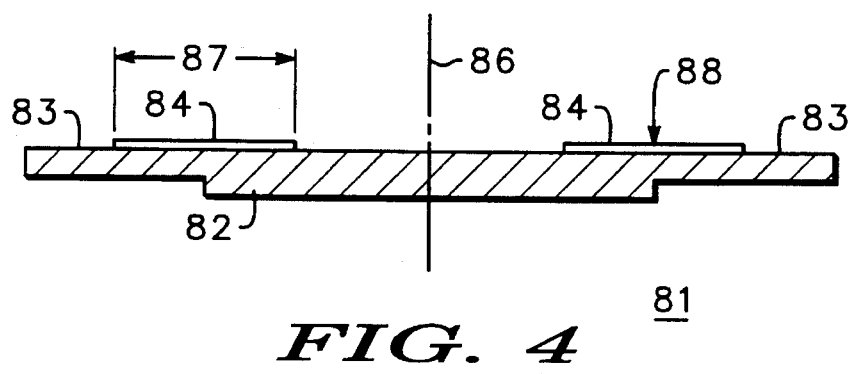
FIG. 4 is a cross-sectional view of a ribbon substrate for forming a leadframe structure according to the present invention.

To describe a preferred method for forming a leadframe structure according to the present invention, FIG. 4 illustrates an enlarged cross-sectional view of a ribbon substrate 81 at an early stage of fabrication. This example is for forming a leadframe structure having an unplated die bond portion. The method of course, is suitable for any masking configuration that at least results in one bond post having an exposed area comprising the leadframe material (e.g., the configuration shown in FIG. 2).

Ribbon substrate 81 is shown in a dual gauge (i.e., two thickness) configuration including tab portion 82 and lead portions 83, which are thinner than tab portion 82. Tab portion 82 typically has a thickness in a range from 0.50 to 1.5 mm (20 to 60 mils) and lead portions 83 typically has a thickness in a range from 0.45 to 0.80 mm (18 to 30 mils). Lead portions 83 have a length that depends on the particular package requirements. Optionally, a single gauge ribbon substrate is used.

Ribbon substrate 81 comprises a metal such as copper, a copper alloy, a copper plated iron/nickel alloy (e.g., Alloy 42) or the like. Ribbon substrates such as ribbon substrate 81 are available from suppliers such as Kobe Steel Corp. of Kobe, Japan, Olin Brass Corp. of East Alton, Ill., and Pongsan Materials Corp. of Pongsan, Korea. During a stamping process, ribbon substrate 81 typically is stamped into two leadframe structures that are parallel to each other along center line 86.

Ribbon substrate 81 is shown after regions of tab portion 82 and lead portions 83 have been masked using masking layer 84. Masking layer 84 prevents a second metal from depositing on the masked portions of ribbon substrate 81 during a subsequent second metal deposition process. Masking layer 84 preferably comprises a masking tape such as a polyethylene terephthalate resin tape (typically sold under the trademark MYLAR®) or the like and is applied to ribbon substrate 81 using well known processing techniques.

That region of tab portion 82 under masking layer 84 becomes the die bond portion (e.g., die bond portion 12 in FIG. 1). In addition and according to the present invention, masking layer 84 has a width 87 such that masking layer 84 extends out onto lead portions 83. With this additional width, the second metal does not deposit onto that region of lead portions 83 (which includes portions that will become bond posts after stamping) under masking layer 84 to form an exposed portion such as exposed portion 33 (shown in FIG. 1). In prior art processes where the die bond portion is masked (i.e., where the die bond portion is unplated and at least the leads are plated), the masking layer terminates where the lead portions begin. This is illustrated by arrow 88 in FIG. 4.

Preferably, masking layer 84 extends out a distance onto lead portions 83 such that after a leadframe structure is stamped or formed from ribbon substrate 81, a sufficient amount of exposed area is left on lead portions 83. This is because during the stamping process, portions of the leads are removed as some leads are disconnected from tab portion 82 and placed in proximity to tab portion 82 (this is more clearly shown, for example, in FIG. 3 where control lead 48 and current carrying lead 49 are above die bond portion 42). Preferably, masking layer 84 extends out onto lead portions 83 at least approximately 0.80 mm (30 mils) in order to provide an exposed area having a width (e.g., width 76 in FIG. 3) of approximately 0.25 mm (10 mils) after the leadframe structure has been stamped.

After ribbon substrate 81 is masked as shown in FIG. 4, a second metal layer is deposited onto the unmasked regions of ribbon substrate 81. Preferably, the second metal is plated onto the unmasked regions of ribbon substrate 81 using well known electroplating techniques. For example, to accommodate an aluminum wire for the current carrying bond wire (e.g., bond wire 44 shown in FIG. 3), ribbon substrate 81 is plated with a nickel-based metal having a thickness in a range from approximately 1.3 to 5.0 microns (50 to 200 micro-inches).

By increasing the width of masking layer 84 such that it extends onto lead portions 83, a cost effective technique for forming an exposed area (e.g., exposed area 33 shown in FIG. 1) for wire bonding a bond wire compatible with the first metal is achieved. The shape of masking layer 84 is easily modified such that all, some, or one of the leads of the finished leadframe include an exposed area of the first metal. However, it is preferred that all leads include an exposed portion when cost issues are of concern.

After electroplating, masking layer 84 is removed and ribbon substrate 81 is stamped to the desired shape or structure (e.g., the structure shown in FIG. 1) using well known processing techniques. It is understood that several leadframe structures are stamped onto ribbon substrate 81. The several leadframe structures are subsequently processed together through process steps including die bonding, wire bonding, and encapsulation to form packaged semiconductor devices. The devices are then separated to form individual units such as power semiconductor device 40 shown in FIG. 3.

By now it should be appreciated that there has been provided a leadframe structure and method that permits a manufacturer to use different types of bond wires within the same power semiconductor package. This greatly increases manufacturing flexibility. In addition, it allows a manufacturer to use smaller diameter wires for wire bonding the control electrode pad to a control lead. With smaller diameter wires, a manufacturer can decrease the size of the control electrode pad, which in turn provides for reduced die sizes, reduced cost, and increased portability.

I claim:

1. A semiconductor leadframe structure comprising:

a tab portion comprised of a first metal; and a first lead coupled to the tab portion, the first lead comprising the first metal and including a first bond post having a first major surface for bonding a connecting wire, wherein the first major surface includes a first portion comprising the first metal and a second portion comprising a second metal different than the first metal.

2. The structure of claim 1 further comprising a second lead and a third lead, each coupled to the tab portion, the second lead having a second bond post having a second major surface for bonding a connecting wire, wherein the second major surface includes a third portion comprising the first metal and a fourth portion comprising the second metal.

3. The structure of claim 2 wherein the tab portion includes a die bond portion.

4. The structure of claim 3 wherein the third lead is connected directly to the die bond portion, and wherein the first lead and the second lead are connected to the third lead with a dambar.

5. The structure of claim 1 wherein the first metal comprises copper.

6. The structure of claim 1 wherein the first metal comprises a copper alloy.

7. The structure of claim 1 wherein the second metal comprises a nickel-based metal.

8. The structure of claim 1 wherein the first portion has a width less than 0.50 mm.

9. A power semiconductor device comprising:

a leadframe structure comprising a first metal, the leadframe structure including a die bond portion and a plurality of leads, the die bond portion having a die bond area, wherein the plurality of leads includes a first lead having a first bond post, a second lead having a second bond post, and a third lead, the first and second leads in spaced relationship with the die bond portion, the third lead connected to the die bond portion, the first bond post having a major surface for bonding a connecting wire, wherein the major surface of the first bond post includes a first portion comprised of the first metal, the second bond post having a major surface for bonding a connecting wire, wherein the major surface of the second bond post includes a first portion comprising a second metal, wherein the first and second metals are different;

a semiconductor die bonded to the die bond area, the semiconductor die including a control electrode pad and a current carrying electrode pad formed on an upper surface;

a first connecting wire coupling the control electrode pad to the first bond post;

a second connecting wire coupling the current carrying electrode to the second bond post; and an encapsulant covering at least the die bond pad, the semiconductor die, the first and second connecting wires, and the first and second bond posts.

10. The device of claim 9 wherein the major surface of the first bond post further includes a second portion comprising the second metal.

11. The device of claim 10 wherein the first and second connecting wires comprise different materials, and wherein the first connecting wire is bonded to the first portion of the first bond post, and wherein the second connecting wire is bonded to the first portion of the second bond post.

12. The device of claim 11 wherein the first metal is selected from a group consisting of copper, a copper alloy, and a copper plated iron/nickel alloy, and wherein the second metal comprises a nickel-based metal.

13. The device of claim 9 wherein the major surface of the second bond post includes a second portion comprising the first metal.

14. The device of claim 9 wherein the first portion of the first bond post has a width less than 0.50 min.

15. The device of claim 9 wherein the semiconductor die includes an IGFET device, and wherein the control electrode pad comprises a gate pad, and wherein the current carrying electrode pad comprises a source pad.

16. A semiconductor structure including:

a die bond portion;

a first lead having a first bond post, the first bond post including a first portion comprising a first material and a second portion comprising a second material different than the first material, wherein the first bond post is in spaced relationship with the die bond portion;

a second lead having a second bond post, the second bond post including a first portion comprising the first material and a second portion comprising the second material, wherein the second bond post is in spaced relationship with the die bond portion;

a semiconductor die coupled to the die bond portion, the semiconductor die including a first electrode and a second electrode;

a first bond wire coupling the first electrode to the first portion of the first bond post;

a second bond wire coupling the second electrode to the second portion of the second bond post; and an encapsulant covering the semiconductor die, the first and second bond wires, and the first and second bond posts.

17. The structure of claim 16 wherein the first bond wire and the second bond wire comprises materials that are different.

18. The structure of claim 16 wherein the first portion of the first bond post and the first portion of the second bond post have a width less than 0.50 mm.

19. The device of claim 12 wherein the first connecting wire comprises a metal selected from a group consisting of gold and copper.

20. The device of claim 12 wherein the second connecting wire comprises aluminum.

* * * * *